(12) United States Patent
Einaga (10) Patent No.: US 8,883,376 B2
(45) Date of Patent: *Nov. 11, 2014

(54) PHOTOSENSITIVE TRANSPARENT RESIN COMPOSITION, PRODUCTION METHOD OF COLOR FILTER, AND COLOR FILTER

(75) Inventor: Hiroyuki Einaga, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 494 days.

This patent is subject to a terminal disclaimer.

(21) Appl. No.: 12/935,324

(22) PCT Filed: Mar. 30, 2009

(86) PCT No.: PCT/JP2009/056491
§ 371 (c)(1),
(2), (4) Date: Sep. 29, 2010

(87) PCT Pub. No.: WO2009/123109
PCT Pub. Date: Oct. 8, 2009

(65) Prior Publication Data
US 2011/0039195 A1 Feb. 17, 2011

(30) Foreign Application Priority Data
Mar. 31, 2008 (JP) ................................. 2008-094248

(51) Int. Cl.
G03F 7/004 (2006.01)
G02B 5/20 (2006.01)
(52) U.S. Cl.
USPC .......................... 430/7; 430/270.1; 430/281.1
(58) Field of Classification Search
None
See application file for complete search history.

(56) References Cited

U.S. PATENT DOCUMENTS 5,806,834 A 9/1998 Yoshida
2007/0254240 A1 11/2007 Sasaki et al.

FOREIGN PATENT DOCUMENTS

| CN | 101124516 A | 2/2008 |
|---|---|---|
| EP | 2 246 739 A1 | 11/2010 |
| JP | 61-109049 A | 5/1986 |
| JP | 8-239509 A | 9/1996 |
| JP | 2000-122065 A | 4/2000 |
| JP | 2000-171786 A | 6/2000 |
| JP | 2001-092128 A | 4/2001 |
| JP | 2001-324807 A | 11/2001 |
| JP | 2004-361448 A | 12/2004 |
| JP | 2006-011397 A | 1/2006 |
| JP | 2006-276488 A | 10/2006 |
| JP | 2006-309125 A | 11/2006 |
| JP | 2007-017814 A | 1/2007 |
| JP | 2007-053153 A | 3/2007 |
| JP | 2007-065640 A | 3/2007 |
| JP | 2007-108275 A | 4/2007 |
| JP | 2007-293127 A | 11/2007 |
| WO | 2006-035807 A1 | 4/2006 |
| WO | WO 2006/035807 A1 | 4/2006 |

OTHER PUBLICATIONS

Computer-generated transaltion of WO 2006/035807 A1 (Apr. 2006).*
Office Action issued on Mar. 13, 2012 in the corresponding Japanese patent application 2009-079933.
International Search Report (PCT/ISA/210) for PCT/JP2009/056491, dated May 19, 2009.
Written Opinion (PCT/ISA/237) for PCT/JP2009/056491, dated May 19, 2009.
Extended European Search Report issued Nov. 24, 2011 in corresponding European Patent Application No. 09728590.2.
Office Action, dated Sep. 3, 2013, issued by the Taiwanese Intellectual Property Office in counterpart Taiwanese Patent Application No. 098110562.

* cited by examiner

Primary Examiner — John A. McPherson
(74) Attorney, Agent, or Firm — Sughrue Mion, PLLC (57) ABSTRACT

With the objective of providing a photosensitive transparent resin composition that is reduced in the exposure illuminance dependency, allows high residual film ratio and little development scum and can stably form a pattern with good resolution, a color filter ensuring little decrease in the transmittance for visible light and enabling display of a high-quality definite image, and a production method thereof, there is provided a photosensitive transparent resin composition containing at least a polymerizable monomer, an alkali-soluble resin, a photopolymerization initiator and a compound represented by the following formula (I):

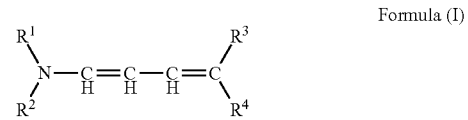

Formula (I)

wherein each of $R^1$ and $R^2$ independently represents a hydrogen atom, an alkyl group having a carbon number of 1 to 20 or an aryl group having a carbon number of 6 to 20, $R^1$ and $R^2$ may be the same or different but are not a hydrogen atom at the same time, $R^1$ and $R^2$ may form a cyclic amino group together with the nitrogen atom, each of $R^3$ and $R^4$ independently represents an electron-withdrawing group, and $R^3$ and $R^4$ may combine with each other to form a cyclic electron-withdrawing group.

16 Claims, 3 Drawing Sheets

PHOTOSENSITIVE TRANSPARENT RESIN COMPOSITION, PRODUCTION METHOD OF COLOR FILTER, AND COLOR FILTER

TECHNICAL FIELD

The present invention relates to a color filter used for a liquid crystal image device (LCD) or an image sensor (CCD, CMOS), a production method of a color filter, and a photosensitive transparent resin composition for use in the production of a color filter. More specifically, the present invention relates to a photosensitive transparent resin composition having high sensitivity and excellent resolution and making it possible to form a desired image pattern by suppressing the development scum and at the same time, reducing the pixel thickening, a method for producing a color filter by using the resin composition, and a color filter.

BACKGROUND ART

In a color filter used for a liquid crystal display device (LCD) or an image sensor (CCD, CMOS), a pattern of a transparent resin layer is sometimes formed according to respective purposes.

Figure 4:
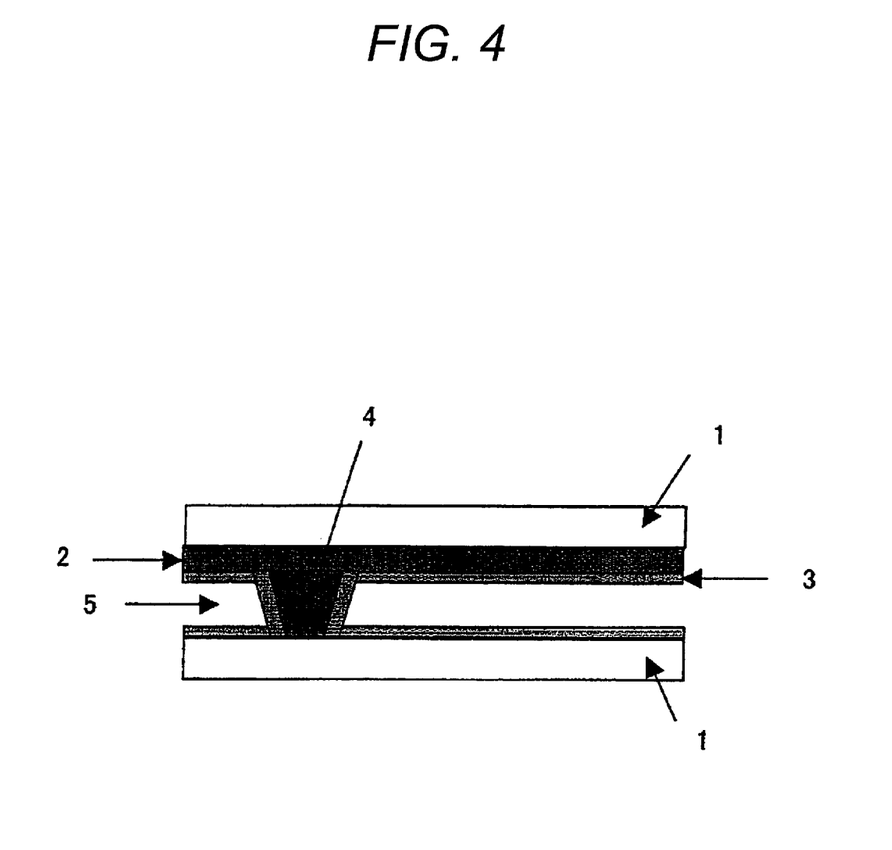
FIG. 4 A schematic view illustrating an example of the cross-sectional shape of a liquid crystal display having a spacer.

In the case of a color filter for liquid crystal display devices, a pattern of a transparent resin layer is formed, for example, to provide a photospacer (see, for example, FIG. 4 and Patent Documents 1 and 2) used for holding a fixed cell gap defined between a color filter layer and a TFT layer or produce a color filter of an MVA (multi-domain vertical alignment) liquid crystal display device (see, for example, Patent Documents 3 and 4). The photospacer is formed on a display screen, that is, on RGB in some cases.

Figure 3:
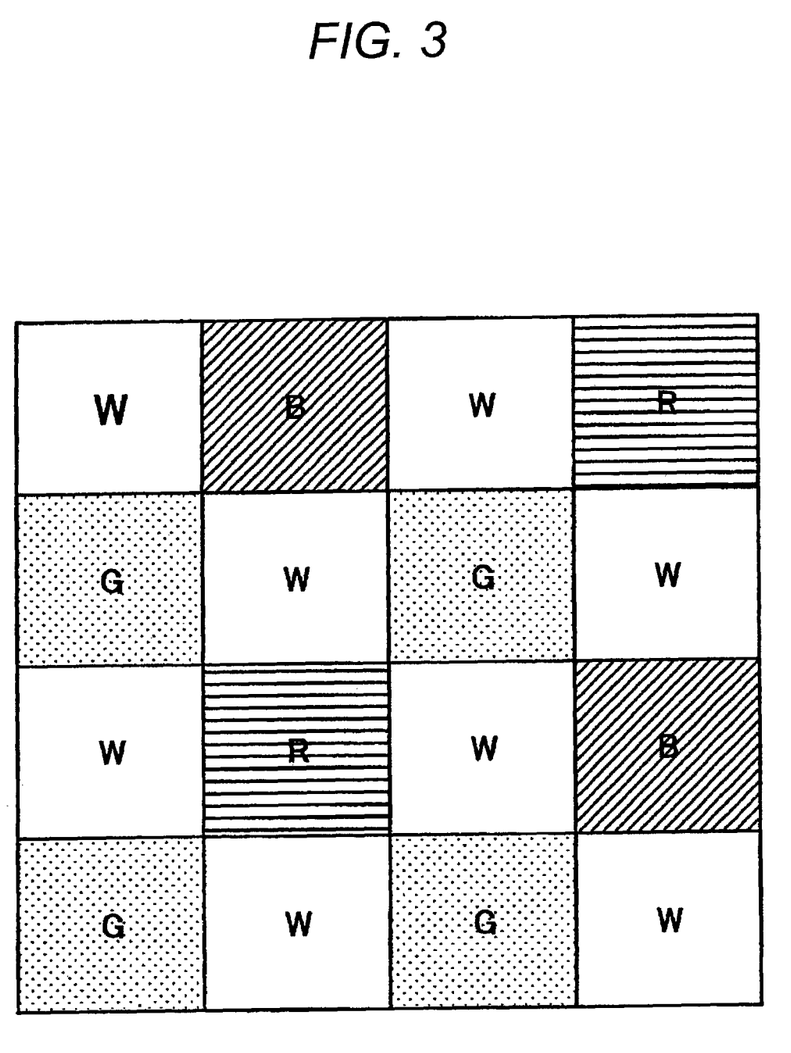
FIG. 3 A schematic view illustrating an example of the color filter of a solid-state imaging device having a W pixel, where W is a white pattern (transparent pattern), R is a red pattern, G is a green pattern and B is a blue pattern.

On the other hand, in the case of a color filter for image sensors, a pattern is formed using a photosensitive transparent resin composition and out of a plurality of colors of a color filter, one color is sometimes made white (transparent) so as to increase the sensitivity (see, for example, FIG. 3 and Patent Document 5). This is because the recent progress in increasing the number of pixels to enhance the resolution and forming a micropixel forces a small opening that leads to sensitivity reduction, and for the purpose of compensating the sensitivity reduction, one color of a color filter is made white (transparent) to thereby raise the sensitivity.

The characteristics, shape and the like required in the pattern formation of the transparent resin layer may vary, but there is a common problem. That is, the transparent resin film is liable to transmit light such as active energy ray (e.g., i line) and this disadvantageously allows the pattern line width of the transparent resin layer to be readily thickened and makes bad the resolution and pattern profile.

In particular, the color filter for image sensors is often faced with a problem in the pattern resolution of the transparent resin layer due to halation at the exposure, because the pattern formation is performed on a wafer.

Examples of the measure heretofore taken to solve the problem above, specifically, to obtain excellent resolution and adequate line width, include a method of adjusting the amount of an active radical generated, that is, adjusting the kind or amount of the photopolymerization initiator. For example, in the case of line width thickening and/or bad resolution, a method of using an initiator with low sensitivity or decreasing the amount of the initiator used, thereby reducing the amount of an active radical and obtaining an adequate line width, is known. However, in recent years, the latitude in the product specification is increasingly becoming strict and under these conditions, it is required to reduce the variation in the line width, film thickness and the like due to exposure illuminance dependency. The problem of exposure illuminance dependency can be hardly solved only by adjusting the kind or amount of the initiator particularly when the coating film has an i-line transmittance. In order to improve the exposure illuminance dependency, a method of increasing the amount of the initiator is usually used, but this conversely brings about excessive thickening of the line width, worsening of the resolution, or generation of a peripheral scum due to halation at the exposure.

As a method for solving these problems, a technique of using an antioxidant and thereby achieving improvement of the resolution of a pattern and reduction in the illuminance dependency of an exposure machine has been disclosed (see, for example, Patent Document 6). Also, a technique of adding a pigment or a dye to decrease the transmittance at the exposure wavelength and thereby achieving improvement of the resolution of a pattern has been disclosed (see, for example, Patent Documents 7 and 8).

Patent Document 1: JP-A-2000-171786
Patent Document 2: JP-A-2001-92128
Patent Document 3: JP-A-2000-122065
Patent Document 4: JP-A-2004-361448
Patent Document 5: JP-A-2007-53153
Patent Document 6: JP-A-2006-11397
Patent Document 7: JP-A-2000-171786
Patent Document 8: JP-A-2006-276488

DISCLOSURE OF THE INVENTION

Problems that the Invention is to Solve

However, in the technique using an antioxidant, the line width, film thickness, spectrum and the like of the pattern formed cannot be prevented from fluctuation particularly when performing exposure with low illuminance (for example, an illuminance corresponding to 95% or less of high illuminance), and it is difficult to stably form a pattern having a good profile.

Also, in the technique of adding a pigment or a dye, the transmittance of the transparent pattern for visible light decreases.

The present invention has been made under these circumstances, and an object of the present invention is to provide a photosensitive transparent resin composition that is reduced in the exposure illuminance dependency (particularly, variation of the profile such as line width at low illuminance corresponding to 95% or less of high illuminance), allows high residual film ratio and little development scum and can stably form a pattern with good resolution; a color filter ensuring little decrease in the transmittance for visible light and enabling display of a high-quality definite image; and a production method thereof. It is the task of the present invention to attain the above-described object.

Means for Solving the Problems

Specific measures for achieving the above-described task are as follows.

<1> A photosensitive transparent resin composition containing at least a polymerizable monomer, an alkali-soluble resin, a photopolymerization initiator and a compound represented by the following formula (I):

[Chem. 1]

Formula (I)

[wherein each of $R^1$ and $R^2$ independently represents a hydrogen atom, an alkyl group having a carbon number of 1 to 20 or an aryl group having a carbon number of 6 to 20, $R^1$ and $R^2$ may be the same or different but are not a hydrogen atom at the same time, $R^1$ and $R^2$ may form a cyclic amino group together with the nitrogen atom, each of $R^3$ and $R^4$ independently represents an electron-withdrawing group, and $R^3$ and $R^4$ may be combined each other to form a cyclic electron-withdrawing group].

<2> The photosensitive transparent resin composition as described in <1> above, wherein the content of the compound represented by formula (I) is from 0.01 to 30 mass % based on the entire solid content of the photosensitive transparent resin composition.

<3> The photosensitive transparent resin composition as described in <1> or <2> above, wherein at least one of the photopolymerization initiator is an oxime ester-based compound.

<4> A production method of a color filter, comprising coating the photosensitive transparent resin composition described in any one of <1> to <3> above, exposing the coated and formed coating layer to at least an ultraviolet ray through a photomask, and developing the coating layer to form a pattern.

<5> A color filter produced by the production method of a color filter described in <4> above.

Advantage of the Invention

According to the present invention, a photosensitive transparent resin composition that is reduced in the exposure illuminance dependency (particularly, variation of the profile such as line width at low illuminance corresponding to 95% or less of high illuminance), allows high residual film ratio and little development scum and can stably form a pattern with good resolution, can be provided.

According to the present invention, a color filter ensuring little decrease in the transmittance for visible light and enabling display of a high-quality definite image, and a production method thereof can be provided.

DESCRIPTION OF REFERENCE NUMERALS AND SIGNS

1 Glass substrate
2 Color filter
3 Liquid crystal orientation film
4 Photo spacer
5 Liquid crystal

BEST MODE FOR CARRYING OUT THE INVENTION

The photosensitive transparent resin composition of the present invention, a color filter configured using the photosensitive transparent resin composition, and a production method thereof are described in detail below.

<<Photosensitive Transparent Resin Composition>>

The photosensitive transparent resin composition of the present invention is configured to contain at least a polymerizable monomer, an alkali-soluble resin, a photopolymerization initiator and a compound represented by the following formula (I) (ultraviolet absorber), and a solvent is generally used therein.

[1] Ultraviolet Absorber

The photosensitive transparent resin composition of the present invention contains, as an ultraviolet absorber, at least one kind of a compound represented by the following formula (I), which is a conjugated diene-based compound. In the present invention, by virtue of using this conjugated diene-based compound, particularly when low illuminance exposure is performed, fluctuation in the performance at the subsequent development can be reduced, and the exposure illuminance dependency related to the pattern forming performance such as line width, film thickness and spectrum of the pattern can be suppressed.

[Chem. 2]

Formula (I)

In formula (I), each of $R^1$ and $R^2$ independently represents a hydrogen atom, an alkyl group having a carbon number of 1 to 20 or an aryl group having a carbon number of 6 to 20, and $R^1$ and $R^2$ may be the same or different but are not a hydrogen atom at the same time.

The alkyl group having a carbon number of 1 to 20 represented by $R^1$ or $R^2$ may be linear, branched or cyclic, and examples thereof include a methyl group, an ethyl group, an n-propyl group, an i-propyl group, an n-butyl group, an i-butyl group, an n-hexyl group, a cyclohexyl group, an n-decyl group, an n-dodecyl group, an n-octadecyl group and an eicosyl group.

The alkyl group having a carbon number of 1 to 20 represented by $R^1$ or $R^2$ may have a substituent, and examples of the substituent include an aryl group, an alkoxy group, an aryloxy group, an acyloxy group, a halogen atom, an acylamino group, an acyl group, an alkylthio group, an arylthio group, a hydroxy group, a cyano group, an alkyloxycarbonyl group, an aryloxycarbonyl group, a substituted carbamoyl group, a substituted sulfamoyl group, a nitro group, a substituted amino group, an alkylsulfonyl group and an arylsulfonyl group. Each of these substituents may be further substituted with such a substituent. The carbon number of the substituent which the alkyl group as $R^1$ or $R^2$ may have is preferably 10 or less.

With respect to the alkyl group represented by $R^1$ or $R^2$, the carbon number of 1 to 20 is a value including the carbon number of the substituent.

Examples of the alkyl group having a substituent include a methoxyethyl group, an ethoxypropyl group, a 2-ethylhexyl group, a hydroxyethyl group, a chloropropyl group, an N,N-diethylaminopropyl group, a cyanoethyl group, a phenethyl group, a benzyl group, a p-t-butylphenethyl group, a p-t-octylphenoxyethyl group, a 3-(2,4-di-t-amylphenoxy)propyl group, an ethoxycarbonylmethyl group, a 2-(2-hydroxyethoxy)ethyl group and a 2-furylethyl group.

The alkyl group having a carbon number of 1 to 20 represented by $R^1$ or $R^2$ is preferably a methyl group, an ethyl group, a propyl group, an n-butyl group or an n-hexyl group.

The aryl group having a carbon number of 6 to 20 represented by $R^1$ or $R^2$ may be a monocyclic ring or a condensed ring and may be a substituted aryl group having a substituent or an unsubstituted aryl group. Examples of the aryl group include a phenyl group, a 1-naphthyl group, a 2-naphthyl group, an anthryl group, a phenanthryl group, an indenyl group, an acenaphthenyl group and a fluorenyl group. Examples of the substituent of the substituted aryl group include an alkyl group, an aryl group, an alkoxy group, an aryloxy group, an acyloxy group, a halogen atom, an acylamino group, an acyl group, an alkylthio group, an arylthio group, a hydroxy group, a cyano group, an alkyloxycarbonyl group, an aryloxycarbonyl group, a substituted carbamoyl group, a substituted sulfamoyl group, a nitro group, a substituted amino group, an alkylsulfonyl group and an arylsulfonyl group. Each of these substituents may be further substituted with such a substituent. The carbon number of the substituent which the aryl group as $R^1$ or $R^2$ may have is preferably 10 or less.

With respect to the aryl group represented by $R^1$ or $R^2$, the carbon number of 6 to 20 is a value including the carbon number of the substituent.

Above all, the aryl group having a carbon number of 6 to 20 represented by $R^1$ or $R^2$ is preferably a substituted or unsubstituted phenyl group, a 1-naphthyl group or a 2-naphthyl group.

$R^1$ and $R^2$ may form a cyclic amino group together with the nitrogen atom. Examples of the cyclic amino group include a piperidino group, a morpholino group, a pyrrolidino group, a hexahydroazepino group and a piperazino group.

Each of $R^1$ and $R^2$ is preferably a lower alkyl group having a carbon number of 1 to 8 (e.g., methyl, ethyl, isopropyl, butyl, sec-butyl, tert-butyl, pentyl, tert-pentyl, hexyl, octyl, 2-ethylhexyl, tert-octyl), or a substituted or unsubstituted phenyl group (e.g., tolyl group, phenyl group, anisyl group, mesityl group, chlorophenyl group, 2,4-di-t-amylphenyl group). It is also preferable that $R^1$ and $R^2$ are combined to form a ring containing the nitrogen atom represented by N in the formula (for example, a piperidine ring, a pyrrolidine ring or a morpholine ring).

In Formula (I), each of $R^3$ and $R^4$ independently represents an electron-withdrawing group. Here, the electron-withdrawing group is an electron-withdrawing group having a Hammett's substituent constant $\sigma_p$ (hereinafter, simply referred to as a "$\sigma_p$ value") of from 0.20 to 1.0, preferably an electron-withdrawing group having a $\sigma_p$ value of 0.30 to 0.8.

The Hammett's rule is an empirical rule advocated by L. P. Hammett in 1935 so as to quantitatively discuss the effect of a substituent on the reaction or equilibrium of a benzene derivative and its propriety is widely admitted at present. The substituent constant determined by the Hammett's rule includes a $\sigma_p$ value and a $\sigma_m$ value, and these values can be found in a large number of general publications and are described in detail, for example, in J. A. Dean (compiler), *Lange's Handbook of Chemistry*, 12th ed., McGraw-Hill (1979), *Kagakuno Ryoiki (Chemistry Region)*, special number, No. 122, pp. 96-103, Nankodo (1979), and *Chemical Reviews*, Vol. 91, pp. 165-195 (1991). In the present invention, it is not meant that the substituent is limited only to those having a known value which can be found in the above-described publications, and needless to say, the substituent includes a substituent whose value is not known in publications but when measured based on the Hammett's rule, falls in the range.

Specific examples of the electron-withdrawing group having a $\sigma_p$ value of 0.20 to 1.0 include an acyl group, an acyloxy group, a carbamoyl group, an alkyloxycarbonyl group, an aryloxycarbonyl group, a cyano group, a nitro group, a dialkylphosphono group, a diarylphosphono group, a diarylphosphinyl group, an alkylsulfinyl group, an arylsulfinyl group, an alkylsulfonyl group, an arylsulfonyl group, a sulfonyloxy group, an acylthio group, a sulfamoyl group, a thiocyanate group, a thiocarbonyl group, an alkyl group substituted with at least two or more halogen atoms, an alkoxy group substituted with at least two or more halogen atoms, an aryloxy group substituted with at least two or more halogen atoms, an alkylamino group substituted with at least two or more halogen atoms, an alkylthio group substituted with at least two or more halogen atoms, an aryl group substituted with another electron-withdrawing group having a $\sigma_p$ value of 0.20 or more, a heterocyclic group, a chlorine atom, a bromine atom, an azo group and a selenocyanate group. Of these substituents, those that can further have a substituent may further have a substituent as described in the above.

In the present invention, $R^3$ is preferably a group selected from a cyano group, —COOR$^5$, —CONHR$^5$, —COR$^5$, and —SO$_2$R$^5$, and $R^4$ is preferably a group selected from a cyano group, —COOR$^6$, —CONHR$^6$, —COR$^6$, and —SO$_2$R$^6$. Each of $R^5$ and $R^6$ independently represents an alkyl group having a carbon number of 1 to 20 or an aryl group having a carbon number of 6 to 20. The alkyl group having a carbon number of 1 to 20 and the aryl group having a carbon number of 6 to 20 carbon atoms, which are represented by $R^5$ or $R^6$, have the same meanings as those in $R^1$ and $R^2$, and preferred embodiments are also the same.

Each of $R^3$ and $R^4$ is preferably an acyl group, a carbamoyl group, an alkyloxycarbonyl group, an aryloxycarbonyl group, a cyano group, a nitro group, an alkylsulfonyl group, an arylsulfonyl group, a sulfonyloxy group or a sulfamoyl group, more preferably an acyl group, a carbamoyl group, an alkyloxycarbonyl group, an aryloxycarbonyl group, a cyano group, an alkylsulfonyl group, an arylsulfonyl group, a sulfonyloxy group or a sulfamoyl group. Also, $R^3$ and $R^4$ may be combined to form a cyclic electron-withdrawing group. Examples of the cyclic electron-withdrawing group formed by combining $R^3$ and $R^4$ with each other include a 6-membered ring containing two carbonyl groups.

At least one of $R^1$, $R^2$, $R^3$, and $R^4$ may be in the form of a polymer derived from a monomer bonded to a vinyl group through a linking group or may be a copolymer with another monomer. In the case of a copolymer, examples of the another monomer include an acrylic acid, an α-chloroacrylic acid, α-alkylacrylic acid and its derivative (for example, an ester derived from acrylic acids such as methacrylic acid, preferably a lower alkyl ester or amide, e.g., acrylamide, methacrylamide, t-butylacrylamide, methyl acrylate, methyl methacrylate, ethyl acrylate, ethyl methacrylate, n-propyl acrylate, n-butyl acrylate, 2-ethylhexyl acrylate, n-hexyl acrylate, octyl methacrylate, lauryl methacrylate, methylenebisacrylamide), a vinyl ester (e.g., vinyl acetate, vinyl propionate, vinyl laurate), acrylonitrile, methacrylonitrile, an aromatic vinyl compound (for example, styrene and its derivative, e.g., vinyltoluene, divinylbenzene, vinylacetophenone, sulfosty- rene, styrenesulfinic acid), itaconic acid, citraconic acid, crotonic acid, vinylidene chloride, a vinyl alkyl ether (e.g., vinyl ethyl ether), a maleic acid ester, N-vinyl-2-pyrrolidone, N-vinylpyridine, and 2- or 4-vinylpyridine.

Among these, an acrylic acid ester, a methacrylic acid ester and an aromatic vinyl compound are preferred.

As for the comonomer compound above, two or more kinds of compounds may be used in combination. For example, n-butyl acrylate and divinylbenzene, styrene and methyl methacrylate, or methyl acrylate and methacrylate, can be used.

Specific preferred examples [Compounds (1) to (14)] of the compound represented by formula (I) are set forth below, but the present invention is not limited thereto.

[Chem. 3]

[Chem. 4]

-continued

[Chem. 5]

x:y=80:20 (mass ratio)

The compound represented by formula (I) for use in the present invention can be synthesized by the methods described in JP-B-44-29620, JP-A-53-128333, JP-A-61-169831, JP-A-63-53543, JP-A-63-53544 and JP-A-63-56651.

Specific methods for representative compounds of the present invention are described below.

—Synthesis Method of Compound (1)—

3-Anilinoacrolein anil (13.3 g) and ethylphenylsulfonyl acetate (14.3 g) are heated in acetic anhydride (40 ml) at 85 to 90° C. for 2 hours, and acetic anhydride is then removed by drying under reduced pressure. Thereto, ethanol (40 ml) and di-n-hexylamine (24.1 g) are added, and the mixture is refluxed for 2 hours. After removing ethanol, the residue is purified by column chromatography and recrystallized with ethanol, whereby the objective product is obtained. Melting point: 95 to 96° C.

The content of the compound (conjugated diene-based compound) represented by formula (I) in the photosensitive transparent resin composition of the present invention is preferably from 0.01 to 30 mass %, more preferably from 0.01 to 20 mass %, still more preferably from 0.01 to 15 mass %, based on the entire solid content of the composition. When the content of this conjugated diene-based compound (ultraviolet absorber) is 0.01 mass % or more, a good light-shielding ability is exhibited at the exposure, making it possible to prevent thickening of the pattern line width due to excessive progress of polymerization and facilitate obtaining a predetermined line width, and generation of peripheral scum can be more suppressed. Also, when the content is 30 mass % or less, a light-shielding ability during exposure is not excessively strong, and polymerization is allowed to proceed more successfully.

The above-described change in the pattern line width is prominent with a transparent photocurable composition exhibiting little absorption of ultraviolet light that is an exposure light source, such as g line, h line and i line. Accordingly, the compound represented by formula (I) (conjugated diene-based compound) is useful particularly when constituting a photosensitive transparent resin composition.

[2] Photopolymerization Initiator

Examples of the photopolymerization initiator include an active halogen compound such as halomethyloxadiazole described in JP-A-57-6096 and halomethyl-s-triazine described in JP-B-59-1281 and JP-A-53-133428; an aromatic carbonyl compound such as ketal, acetal and benzoin alkyl ethers described in U.S. Pat. No. 4,318,791 and European Unexamined Patent Publication of EP-88050A; an aromatic ketone compound such as benzophenones described in U.S. Pat. No. 4,199,420; a compound such as (thio)xanthone and acridine compound described in FR 2456741: a compound such as coumarins and lophine dimers described in JP-A-10-62986; and sulfonium organic boron complex described in JP-A-8-015521

The photopolymerization initiator is preferably, for example, an acetophenone-based, ketal-based, benzophenone-based, benzoin-based, benzoyl-based, xanthone-based, triazine-based, halomethyloxadiazole-based, acridine-based, coumarin-based, lophine dimers-based, biimidazole-based or oxime ester-based photopolymerization initiator.

Suitable examples of the acetophenone-based photopolymerization initiator include 2,2-diethoxyacetophenone, p-dimethylaminoacetophenone, 2-hydroxy-2-methyl-1-phenyl-propan-1-one, p-dimethylaminoacetophenone and 4'-isopropyl-2-hydroxy-2-methyl-propiophenone.

Suitable examples of the ketal-based photopolymerization initiator include benzyl dimethyl ketal and benzyl-β-methoxy ethyl acetal.

Suitable examples of the benzophenone-based photopolymerization initiator include benzophenone, 4,4'-(bisdimethylamino)benzophenone, 4,4'-(bisdiethylamino)benzophenone, 4,4'-dichlorobenzophenone, 1-hydroxy-cyclohexyl-phenyl-ketone, 2-benzyl-2-dimethylamino-1-(4-morpholinophenye-butanone-1,2-tolyl-2-dimethylamino-1-(4-morpholinophenyl)butanone-1,2-methyl-1-[4-(methylthio)phenyl]-2-morpholinopropanone-1.

Suitable examples of the benzoin-based or benzoyl-based photopolymerization initiator include benzoin isopropyl ether, benzoin isobutyl ether, benzoin methyl ether and methyl-o-benzoylbenzoate.

Suitable examples of the xanthone-based photopolymerization initiator include diethylthioxanthone, diisopropylthioxanthone, monoisopropyl thioxanthone and chlorothioxanthone.

Suitable examples of the triazine-based photopolymerization initiator include 2,4-bis(trichloromethyl)-6-p-methoxyphenyl-s-triazine, 2,4-bis(trichloromethyl)-6-p-methoxystyryl-s-triazine, 2,4-bis(trichloromethyl)-6-(1-p-dimethylaminophenyl)-1,3-butadienyl-s-triazine, 2,4-bis(trichloromethyl)-6-biphenyl-s-triazine, 2,4-bis(trichloromethyl)-6-(p-methylbiphenyl)-s-triazine, p-hydroxyethoxystyryl-2,6-di(trichloromethyp-s-triazine, methoxystyryl-2,6-di(trichloromethyl)-s-triazine, 3,4-dimethoxystyryl-2,6-di(trichloromethyl)-s-triazine, 4-benzoxolane-2,6-di(trichloromethyl)-s-triazine, 4-(o-bromo-p-N,N-(diethoxycarbonylamino)-phenyl)-2,6-di (chloromethyl)-s-triazine and 4-(p-N,N-(diethoxycarbonylamino)-phenyl)-2,6-di(chloromethyl)-s-triazine.

Suitable examples of the halomethyloxadiazole-based photopolymerization initiator include 2-trichloromethyl-5-styryl-1,3,4-oxadiazole, 2-trichloromethyl-5-(cyanostyryl)-1,3,4-oxadiazole, 2-trichloromethyl-5-(naphth-1-yl)-1,3,4-oxadiazole and 2-trichloromethyl-5-(4-styryl)styryl-1,3,4-oxadiazole.

Suitable examples of the acridine-based photopolymerization initiator include 9-phenylacridine and 1,7-bis(9-acridinyl)heptane.

Suitable examples of the coumarin-based photopolymerization initiator include 3-methyl-5-amino-((s-triazin-2-yl)amino)-3-phenylcoumarin, 3-chloro-5-diethylamino-((s-triazin-2-yl)amino)-3-phenylcoumarin and 3-butyl-5-dimethylamino-((s-triazin-2-yl)amino)-3-phenylcoumarin.

Suitable examples of the lophine dimer-based photopolymerization initiator include 2-(o-chlorophenyl)-4,5-diphenylimidazolyl dimer, 2-(o-methoxyphenyl)-4,5-diphenylimidazolyl dimer and 2-(2,4-dimethoxyphenyl)-4,5-diphenylimidazolyl dimer.

Suitable examples of the biimidazole-based photopolymerization initiator include 2-mercaptobenzimidazole and 2,2'-benzothiazolyl disulfide.

Suitable examples of the oxime ester-based photopolymerization initiator include 2-(O-benzoyloxime)-1-[4-(phenylthio)phenyl]-1,2-octanedione, 1-(O-acetyloxime)-1-[9-ethyl-6-(2-methylbenzoyl)-9H-carbazol-3-yl]ethanone, 1-phenyl-1,2-propanedione-2-(o-ethoxycarbonyl)oxime and O-benzoyl-4'-(benzmercapto)benzoyl-hexyl-ketoxime.

Other examples include 2,4,6-trimethylphenylcarbonyl-diphenylphosphonyl oxide and hexafluoro-phosphoro-trialkylphenylphosphonium salt.

The present invention is not limited to these photopolymerization initiators, and other known photopolymerization initiators can be used. Examples thereof include vicinal polyketolaldonyl compounds described in the specification of U.S. Pat. No. 2,367,660, α-carbonyl compounds described in U.S. Pat. Nos. 2,367,661 and 2,367,670, acyloin ethers described in U.S. Pat. No. 2,448,828, aromatic acyloin compounds substituted with an α-hydrocarbon described in U.S. Pat. No. 2,722,512, polynuclear quinone compounds described in of U.S. Pat. Nos. 3,046,127 and 2,951,758, combinations of triarylimidazole dimer/p-aminophenyl ketone described in U.S. Pat. No. 3,549,367, benzothiazole-based compounds/trihalomethyl-s-triazine-based compounds described in JP-B-51-48516, and oxime ester compounds described in *J.C.S. Perkin II*, 1653-1660 (1979), *J.C.S. Perkin II*, 156-162 (1979), *Journal of Photopolymer Science and Technology*, 202-232 (1995) and JP-A-2000-66385.

These photopolymerization initiators can also be used in combination thereof

Among the above-described photopolymerization initiators, from the standpoint that when used in combination with the conjugated diene-based compound represented by formula (I), high sensitivity can be obtained by the addition in a small amount, an oxime ester-based compound is preferred, and 2-(O-benzoyloxime)-1-[4-(phenylthio)phenyl]-1,2-octanedione, 1-(O-acetyloxime)-1-[9-ethyl-6-(2-methylbenzoyl)-9H-carbazol-3-yl]ethanone are more preferred.

The content of the photopolymerization initiator in the photosensitive transparent resin composition is preferably from 0.1 to 10.0 mass %, more preferably from 0.5 to 5.0 mass %, based on the entire solid content of the composition. When the content of the photopolymerization initiator is within the range above, the polymerization reaction is allowed to successfully proceed and a film with good strength can be formed.

In addition to the components above, a thermal polymerization inhibitor is preferably further added to the photosensitive transparent resin composition of the present invention. Examples of the useful thermal polymerization inhibitor include hydroquinone, p-methoxyphenol, di-t-butyl-p-cresol, pyrogallol, t-butylcatechol, benzoquinone, 4,4'-thio-bis(3-methyl-6-t-butylphenol), 2,2'-methylenebis(4-methyl-6-t-butylphenol) and 2-mercaptobenzimidazole.

[3] Polymerizable Monomer

The photosensitive transparent resin composition of the present invention contains at least one kind of a polymerizable monomer.

The polymerizable monomer is preferably a compound having at least one addition-polymerizable ethylenic double bond and having a boiling point of 100° C. or more at normal pressure. By containing the polymerizable monomer together with the above-described photopolymerization initiator and the like, the photosensitive transparent resin composition of the present invention can be configured to be negative working.

Examples of the polymerizable monomer include a monofunctional acrylate or methacrylate such as polyethylene glycol mono(meth)acrylate, polypropylene glycol mono(meth)acrylate and phenoxyethyl(meth)acrylate; polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol(meth)acrylate, trimethylolpropane tri(acryloyloxypropyl) ether, tri(acryloyloxyethyl) isocyanurate, and a monomer obtained by adding an ethylene oxide or a propylene oxide to a polyfunctional alcohol such as glycerin or trimethylolethane and then (meth)acrylating the adduct; urethane acrylates described in JP-B-48-41708, JP-B-50-6034 and JP-A-51-37193; polyester acrylates described in JP-A-48-64183, JP-B-49-43191 and JP-B-52-30490; a polyfunctional acrylate or methacrylate such as epoxy acrylates which are a reaction product between an epoxy resin and a (meth)acrylic acid, and a mixture thereof.

Other examples include those introduced as a photocurable monomer or oligomer in *Journal of the Adhesion Society of Japan*, Vol. 20, No. 7, pp. 300-308. Above all, the polymerizable monomer is preferably a polyfunctional (meth)acrylic compound.

The content of the polymerizable monomer in the photosensitive transparent resin composition is preferably from 10 to 80 mass %, more preferably from 10 to 40 mass %, based on the entire solid content of the composition. When the content is within the range above, the cure degree and the dissolution of the unexposed area can be sufficiently kept, an adequate cure degree of the exposed area can be maintained, and extreme reduction in the dissolution of the unexposed area can be prevented.

[4] Alkali-Soluble Resin

In the photosensitive transparent resin composition of the present invention, an alkali-soluble resin can be used. The alkali-soluble resin is not particularly limited as long as it is alkali-soluble, but the alkali-soluble resin is preferably selected in view of heat resistance, developability, availability and the like.

The alkali-soluble resin is preferably a linear organic high-molecular-weight polymer soluble in an organic solvent and developable with an aqueous weakly alkaline solution. Examples of such a linear organic high-molecular-weight polymer include a polymer having a carboxylic acid in the side chain, such as methacrylic acid copolymers, acrylic acid copolymers, itaconic acid copolymers, crotonic acid copolymers, maleic acid copolymers and partially esterified maleic acid copolymers described in JP-A-59-44615, JP-B-54-34327, JP-B-58-12577, JP-B-54-25957, JP-A-59-53836 and JP-A-59-71048. An acidic cellulose derivative having a carboxylic acid in the side chain is useful.

Other examples of the useful alkali-soluble resin include a resin obtained by adding an acid anhydride to a polymer having a hydroxyl group, a polyhydroxystyrene-based resin, a polysiloxane-based resin, poly(2-hydroxyethyl(meth)acrylate), polyvinylpyrrolidone, polyethylene oxide, and polyvinyl alcohol.

The linear organic high-molecular-weight polymer may be a polymer obtained by copolymerizing a monomer having a hydrophilic group. Examples thereof include an alkoxyalkyl (meth)acrylate, a hydroxyalkyl(meth)acrylate, a glycerol (meth)acrylate, a (meth)acrylamide, an N-methylol acrylamide, a secondary or tertiary alkyl acrylamide, a dialkylaminoalkyl(meth)acrylate, a morpholine(meth)acrylate, an N-vinylpyrrolidone, N-vinylcaprolactam, vinylimidazole, vinyltriazole, a methyl(meth)acrylate, an ethyl(meth)acrylate, a branched or linear propyl(meth)acrylate, a branched or linear butyl(meth)acrylate, and a phenoxyhydroxypropyl(meth)acrylate.

As for the monomer having a hydrophilic group, a monomer having a tetrahydrofurfuryl group, a phosphoric acid group, a phosphoric acid ester group, a quaternary ammonium salt group, an ethyleneoxy chain, a propyleneoxy chain, a sulfonic acid or a group derived from its salt, a morpholinoethyl group or the like is also useful.

Moreover, in order to improve the crosslinking efficiency, the alkali-soluble resin may have a polymerizable group in its side chain and, for example, a polymer having, in its side chain, an allyl group, a (meth)acryl group, an allyloxyalkyl group or the like is also useful.

Examples of the useful polymer having a polymerizable group include commercially available products such as KS Resist-106 (produced by Osaka Organic Chemical Industry Ltd.) and Cyclomer P Series (produced by Daicel Chemical Industries, Ltd.). In addition, in order to improve the strength of the cured film, an alcohol-soluble nylon or a polyether of 2,2-bis-(4-hydroxyphenyl)-propane and epichlorohydrin is also useful.

Among these various alkali-soluble resins, a polyhydroxystyrene-based resin, a polysiloxane-based resin, an acrylic resin, an acrylamide-based resin, and an acryl/acrylamide copolymer resin are preferred from the standpoint of heat resistance, and an acrylic resin, an acrylamide-based resin and an acryl/acrylamide copolymer resin are preferred in view of developability control.

Preferred examples of the acrylic resin include a copolymer obtained by polymerization of a monomer selected from a benzyl(meth)acrylate, a (meth)acrylic acid, a hydroxyethyl (meth)acrylate and a (meth)acrylamide, and commercially available products such as KS Resist-106 (produced by Osaka Organic Chemical Industry Ltd.) and Cyclomer P Series (produced by Daicel Chemical Industries, Ltd.).

From the standpoint of developability, liquid viscosity and the like, the alkali-soluble resin is preferably a polymer having a mass average molecular weight of 1,000 to $2 \times 10^5$ (in terms of polystyrene as measured by the GPC method), more preferably from 2,000 to $1 \times 10^5$, still more preferably from 5,000 to $5 \times 10^4$.

In view of developability and the like, the content of the alkali-soluble resin in the photosensitive transparent resin composition is preferably from 10 to 90 mass %, more preferably from 20 to 80 mass %, and more preferably from 30 to 70 mass %, based on the entire solid content of the composition.

[5] Organic Solvent

The photosensitive transparent resin composition of the present invention can be generally configured using an organic solvent.

Fundamentally, the organic solvent is not particularly limited as long as the solubility of each component or coatability of the photosensitive transparent resin composition are satisfied, but the organic solvent is preferably selected by taking into consideration particularly the solubility of ultraviolet absorber and binder, the coatability and the safety. In preparing the photosensitive transparent resin composition of the present invention, the composition preferably contains at least two kinds of organic solvents.

Preferred examples of the organic solvent include esters such as ethyl acetate, n-butyl acetate, isobutyl acetate, amyl formate, isoamyl acetate, isobutyl acetate, butyl propionate, isopropyl butyrate, ethyl butyrate, butyl butyrate, alkyl esters, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate and ethyl ethoxyacetate;

3-oxypropionic acid alkyl esters such as methyl 3-oxypropionate and ethyl 3-oxypropionate, e.g., methyl 3-methoxypropionate, ethyl 3-methoxypropionate, methyl 3-ethoxypropionate and ethyl 3-ethoxypropionate; 2-oxypropionic acid alkyl esters such as methyl 2-oxypropionate, ethyl 2-oxypropionate and propyl 2-oxypropionate, e.g., methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate and ethyl 2-ethoxy-2-methylpropionate; methyl pyruvate, ethyl pyruvate, propyl pyruvate, methyl acetoacetate, ethyl acetoacetate, methyl 2-oxobutanoate and ethyl 2-oxobutanoate;

ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate and propylene glycol monopropyl ether acetate;

ketones such as methyl ethyl ketone, cyclohexanone, 2-heptanone and 3-heptanone; and aromatic hydrocarbons such as toluene and xylene.

As described above, from the standpoint of improving the solubility of ultraviolet absorber and alkali-soluble resin, the coated surface state and the like, those organic solvents may be used in combination of two or more thereof. In particular, a mixed solution composed of two or more kinds of solvents selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether and propylene glycol methyl ether acetate is suitably used.

In view of coatability, the content of the organic solvent in the photosensitive transparent resin composition is preferably set such that the total solid content concentration of the composition becomes from 5 to 80 mass %, more preferably from 5 to 60 mass %, still more preferably from 10 to 50 mass %.

[6] Other Additives

In the photosensitive transparent resin composition of the present invention, various additives such as filler, polymer compound other than those described above, surfactant, adhesion promoter, antioxidant and aggregation inhibitor can be blended, if desired.

Specific examples of these additives include a filler such as glass and alumina; a polymer compound other than the binder resin, such as polyvinyl alcohol, polyacrylic acid, polyethylene glycol monoalkyl ether and polyfluoroalkyl acrylate; a surfactant such as nonionic surfactant, cationic surfactant and anionic surfactant; an adhesion promoter such as vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane and 3-mercaptopropyltrimethoxysilane; an antioxidant such as 2,2-thiobis(4-methyl-6-t-butylphenol) and 2,6-di-t-butyl phenol; and an aggregation inhibitor such as sodium polyacrylate.

Furthermore, in the case of increasing the alkali solubility of the photosensitive transparent resin composition in the ultraviolet non-irradiated portion and thereby more improving the developability, the photosensitive transparent resin composition of the present invention may contain an organic carboxylic acid, preferably a low-molecular-weight organic carboxylic acid having a molecular weight of 1,000 or less.

Specific examples of the organic carboxylic acid include: an aliphatic monocarboxylic acid such as formic acid, acetic acid, propionic acid, butyric acid, valeric acid, pivalic acid, caproic acid, diethylacetic acid, enanthic acid and caprylic acid; an aliphatic dicarboxylic acid such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid and citraconic acid; an aliphatic tricarboxylic acid such as tricarballylic acid, aconitic acid and camphoronic acid; an aromatic monocarboxylic acid such as benzoic acid, toluic acid, cuminic acid, hemellitic acid and mesitylene acid; an aromatic polycarboxylic acid such as phthalic acid, isophthalic acid, terephthalic acid, trimellitic acid, trimesic acid, mellophanic acid and pyromellitic acid; and other carboxylic acids such as phenylacetic acid, hydratropic acid, hydrocinnamic acid, mandelic acid, phenylsuccinic acid, atropic acid, cinnamic acid, methyl cinnamate, benzyl cinnamate, cinnamylideneacetic acid, coumaric acid and umbellic acid.

<<Method for Forming Transparent Pattern in Color Filter for Image Sensors>>

The method for forming a transparent pattern of a color filter by using the photosensitive transparent resin composition of the present invention for the purpose of increasing the sensitivity of an image sensor is described below.

The photosensitive transparent resin composition is coated on a silicon wafer directly or through another layer and then dried to form a coating film (coating formation step); the coating film is exposed in a specific pattern (exposure step); the exposed coating film is developed with an alkali developer (developing step); and the coating film after development is subjected to a heating treatment (post baking step). Through these steps, a pattern can be formed. If desired, the method may contain a step of curing the resist pattern by heating or exposure.

Examples of the method which can bused for coating the photosensitive transparent resin composition include various methods such as spray method, roll coating method and spin coating method.

In the exposure step above, the coating layer formed in the coating formation step is, for example, exposed in a specific pattern by imagewise irradiating an actinic ray or radiation through a mask or the like. Examples of the actinic ray or radiation include infrared ray, visible light, ultraviolet ray, far ultraviolet ray, X-ray and electron beam, but it is preferred that the actinic ray or radiation is at least an ultraviolet ray. In particular, an ultraviolet ray such as g line, h line and i line is preferably used. In the case of a color filter for solid-stage imaging devices, the exposure is preferably exposure by a stepper exposure machine using mainly i line.

In view of throughput, the exposure illuminance of the stepper exposure machine used for the production of a color filter for solid-state imaging devices is preferably 300 $mW/cm^2$ or more, more preferably 500 $mW/cm^2$ or more, still more preferably 1,000 $mW/cm^2$ or more. In general, similarly in view of throughput, the exposure dose is preferably 1,000 $mJ/cm^2$ or less, more preferably 500 $mJ/cm^2$ or less, still more preferably 300 $mJ/cm^2$ or less.

In the developing step above, the exposed coating layer is developed with a developer to reveal the pattern.

The developer may be any developer as long as it dissolves the unexposed area of the photosensitive transparent resin composition and hardly dissolves the exposed area (radiation-irradiated portion). Specifically, various organic solvents, a combination thereof, and an aqueous alkaline solution can be used.

Examples of the organic solvent include the above-described solvents which can be used for preparing the photosensitive transparent resin composition.

Examples of the aqueous alkaline solution include sodium hydroxide, potassium hydroxide, sodium carbonate, sodium silicate, sodium metasilicate, aqueous ammonia, ethylamine, diethylamine, dimethylethanolamine, tetramethylammonium hydroxide, tetraethylammonium hydroxide, choline, pyrrole, piperidine and 1,8-diazabicyclo-[5.4.0]-7-undecene.

The developer is preferably an aqueous alkaline solution whose alkali concentration is adjusted to preferably a pH of 11 to 13, more preferably from 11.5 to 12.5. When the alkali concentration is a pH of 13 or less, roughening or separation of the pattern and reduction in the residual film ratio can be more unfailingly avoided, and when it is a pH of 11 or more, the development proceeds at a good rate and generation of scum can be more successfully prevented.

In the developing step, the film is developed using a developer such as aqueous alkaline solution, and examples of the development method include a dipping method, a spray method and a puddle method. The development temperature is preferably from 15 to 40° C. Also, after the development, washing with running water is generally performed.

The pattern after the alkali development is again exposed to radiation and then, preferably, subjected to post baking in a heating apparatus such as hot plate and oven at a predetermined temperature, for example, at 150 to 250° C., for a predetermined time, for example, for 5 to 30 minutes on a hot plate and for 30 to 90 minutes in an oven, whereby a predetermined transparent pattern can be formed.

The thus-formed transparent pattern has an array of a plurality of rectangular pixels on a substrate, and the length of one side (longest side) of the pixel is generally from 1.0 to 20 μm or less. In particular, from the standpoint of efficient use of a substrate such as silicon wafer, minimization of a device using the solid-state imaging device, and high-speed operation of the solid-state imaging device, the length is preferably 5 μm or less, more preferably 4 μm or less, still more preferably 3 μm or less.

The thickness of a pixel in the color filter of the present invention is not particularly limited, but in view of efficient use of a substrate such as silicon wafer and shading of a device using the solid-state imaging device, the thickness tends to be small. The thickness is preferably 2 μm or less, more preferably 1.5 μm or less, still more preferably 1.0 μm or less.

<<Formation Method of Photospacer for Liquid Crystal Displays>>

The method for forming a photospacer for liquid crystal displays by using the photosensitive transparent resin composition of the present invention is described below.

In the case of using the photosensitive transparent resin composition for forming a spacer of LCD, the spacer can be provided between an array substrate and a color filter substrate. Specifically, there are cases of (1) providing the spacer on the ITO electrode layer of an array substrate, (2) providing the spacer on the colored layer of a color filter substrate, and (3) providing the spacer from both the array substrate side and the color filter substrate side. Also, the spacer can be provided on an orientation film (the orientation film is provided on the colored layer of the color filter) such as polyimide.

The formation of a photospacer includes a step of coating the photosensitive transparent resin composition on a glass substrate directly or through another layer and then drying it to form a coating film (coating formation step), a step of exposing the coating film in a specific pattern (exposure step), a step of developing the exposed coating film with an alkali developer (developing step), and a step of subjecting the coating film after development to a heating treatment (post baking step). Through these steps, a pattern can be formed. If desired, the method may contain a step of curing the resist pattern by heating or exposure.

Examples of the substrate which can be used include those composed of glass, quartz, silicon or transparent resin.

Examples of the method which can bused for coating the photosensitive transparent resin composition include various methods such as spray method, roll coating method and spin coating method.

In the exposure step above, the coating layer formed in the coating formation step is, for example, exposed in a specific pattern by imagewise irradiating an actinic ray or radiation through a mask or the like. Examples of the actinic ray or radiation include infrared ray, visible light, ultraviolet ray, far ultraviolet ray, X-ray and electron beam, but it is preferred that the actinic ray or radiation is at least an ultraviolet ray. In particular, an ultraviolet ray such as g line, h line and i line is preferably used. In use for a liquid crystal display device, the exposure is preferably exposure by a proximity exposure machine or mirror projection exposure machine using mainly h line or i line.

In view of throughput, the exposure illuminance of the proximity exposure machine or mirror projection exposure machine used for the production of a color filter for liquid crystal display devices is preferably 10 mW/cm$^2$ or more, more preferably 20 mW/cm$^2$ or more, still more preferably 30 mW/cm$^2$ or more. In general, similarly in view of throughput, the exposure dose is preferably 300 mJ/cm$^2$ or less, more preferably 200 mJ/cm$^2$ or less, still more preferably 100 mJ/cm$^2$ or less.

In the developing step above, the exposed coating layer is developed with a developer to reveal the pattern.

The developer may be any developer as long as it dissolves the unexposed area of the photosensitive transparent resin composition and hardly dissolves the exposed area (radiation-irradiated portion). Specifically, various organic solvents, a combination thereof, and an aqueous alkaline solution can be used.

Examples of the organic solvent include the above-described solvents which can be used for preparing the photosensitive transparent resin composition.

Examples of the aqueous alkaline solution include sodium hydroxide, potassium hydroxide, sodium carbonate, sodium silicate, sodium metasilicate, aqueous ammonia, ethylamine, diethylamine, dimethylethanolamine, tetramethylammonium hydroxide, tetraethylammonium hydroxide, choline, pyrrole, piperidine and 1,8-diazabicyclo-[5.4.0]-7-undecene.

The developer is preferably an aqueous alkaline solution whose alkali concentration is adjusted to preferably a pH of 11 to 13, more preferably a pH of 11.5 to 12.5. When the alkali concentration is a pH of 13 or less, roughening or separation of the pattern and reduction in the residual film ratio can be avoided, and when it is a pH of 11 or more, the development proceeds at a good rate and generation of scum can be prevented.

In the developing step, the film is developed using a developer such as aqueous alkaline solution, and examples of the development method include a dipping method, a spray method and a puddle method. The development temperature is preferably from 15 to 40° C. Also, after the development, washing with running water is generally performed.

The pattern after the alkali development is again exposed to radiation and then, preferably, subjected to post baking in a heating apparatus such as hot plate and oven at a predetermined temperature, for example, at 150 to 250° C., for a predetermined time, for example, for 5 to 30 minutes on a hot plate and for 30 to 90 minutes in an oven, whereby a predetermined transparent pattern can be formed.

In the present invention, the dry thickness of the layer formed using the photosensitive transparent resin composition is, in the case of forming a photospacer, preferably from 1 to 50 μm, more preferably from 1.0 to 20 μm, still more preferably from 1.5 to 10 μm; in the case of forming a flattening layer, preferably from 0.1 to 3 μm, more preferably from 0.2 to 1.5 μm; and in the case of forming contact holes, preferably from 0.1 to 6.0 μm, more preferably from 0.2 to 3.0 μm.

Examples of the pattern form for a photospacer include dotted, striped and checkered configurations. As for the pitch, a pitch matching the color filter is reasonable, and a pitch at an integral multiple thereof is preferred. The shape may be a quadrangular prism, a cylinder, an elliptic cylinder, a square pyramid, a square board with a trapezoidal cross-section, or a polygon thereof.

EXAMPLES

The present invention is described in greater detail below by referring to Examples, but as long as the gist thereof is observed, the present invention is not limited to these Examples. Incidentally, unless otherwise indicated, the "parts" and "%" are on the mass basis.

Example 1

Formation of Transparent Pattern of Color Filter for Solid-State Imaging Device

(Preparation of Resist Solution for Flattening Film)

The components shown below were mixed and stirred in a homogenizer stirrer to prepare a resist solution for flattening film.

| <Composition of Resist Solution for Flattening Film> | |
|---|---|
| Propylene glycol monomethyl ether acetate solution of benzyl methacrylate/methacrylic acid (=70/30 [molar ratio]) copolymer (product name: Acrybase FF-187, produced by Fujikura Kasei Co., Ltd., 45%, mass average molecular weight: 30,000) | 22 parts |
| Dipentaerythritol hexaacrylate (product name: KAYARAD DPHA, produced by Nippon Kayaku Co., Ltd.) | 6.5 parts |
| Propylene glycol monomethyl ether acetate (product name: MMPGAC, produced by Daicel Chemical Industries, Ltd.) | 13.8 parts |
| Ethyl-3-ethoxy propionate (product name: ethyl-3-ethoxy propionate, produced by Nagase & Co., Ltd.) | 12.3 parts |
| Halomethyltriazine compound (Compound (I) shown below) (product name: Triazine PP, produced by PANCHIM) | 0.3 parts |

Halomethyltriazine Compound (I) is the compound shown below.

[Chem. 6]

Compound I (Formation of Flattening Film)

This resist solution for flattening film was coated on a 6-inch silicon wafer by spin coating. The wafer was then heat-treated on a hot plate at a surface temperature of 120° C. for 120 seconds to obtain a uniform coating film having a thickness of about 2.0 μm on the silicon wafer. Subsequently, the coating film was cured in an oven under the condition of 220° C. for 1 hour to obtain a flattening film.

(Preparation of Photosensitive Transparent Resin Composition)

The following composition mixed and stirred to prepare a photosensitive transparent resin composition.

<Composition of Photosensitive Transparent Resin Composition>

The components shown below were mixed and stirred in a magnetic stirrer to prepare a photosensitive transparent resin composition of the present invention.

| | |
|---|---|
| Resin A (propylene glycol monomethyl ether acetate solution of benzyl methacrylate/methacrylic acid (=70/30 [molar ratio]) copolymer (product name: Acrybase FF-187, produced by Fujikura Kasei Co., Ltd., 30%, mass average molecular weight: 30,000) | 26.3 parts |
| Monomer A (dipentaerythritol hexaacrylate, product name: KAYARAD DPHA, produced by Nippon Kayaku Co., Ltd.) | 7.89 parts |
| Initiator A (Compound (II) shown below, product name: IRGACURE OXE01, produced by Ciba Specialty Chemicals) | 2.63 parts |
| Compound (III) shown below (ultraviolet absorber) | 1.26 parts |
| Solvent A (organic solvent) (propylene glycol monomethyl ether acetate, product name: MMPGAC, produced by Daicel Chemical Industries, Ltd.) | 57.86 parts |
| Surfactant A (fluorine-containing surfactant, Megaface F-144, produced by Dainippon Ink and Chemicals Inc.) | 4.21 parts |
| Polymerization Inhibitor A (p-methoxyphenol, product name: p-methoxyphenol, produced by Kanto Chemical Co., Ltd.) | 0.001 parts |

[Chem. 7]

Compound II

[Chem. 8]

Compound III

—Production of Coating Film—

The photosensitive transparent resin composition obtained above was coated on the flattening film on the silicon wafer by spin coating, and the wafer was dried by a heating treatment on a hot plate at a coating film surface temperature of 100° C. for 120 seconds to form a coating film having a thickness of about 0.8 μm after drying.

—Formation of Transparent Pattern of Color Filter for Solid-State Imaging Device—

The coating film after drying was exposed with an exposure dose of 200 mJ/cm$^2$ by using an i-line stepper (FPA-3000i5+ manufactured by Canon Inc.) through a mask pattern in which 1.2 μm-square pixels are aligned in each 4 mm×3 mm region on a substrate, at two illuminance levels of 1,200 mW/cm$^2$ (high illuminance) and 600 mW/cm$^2$ (low illuminance).

The coating film after pattern exposure was subjected to puddle development using a 60% aqueous solution of organic alkaline developer CD-2000 (produced by Fujifilm Electronic Materials Co., Ltd.) at room temperature for 60 seconds and further to rinsing with pure water by spin shower for 20 seconds. Subsequently, the coating film was further washed with pure water, and water drops were blown off with a high-pressure air. Thereafter, the substrate was naturally dried and then subjected to a post-baking treatment on a hot plate at 220° C. for 300 seconds to form a transparent pattern on the silicon wafer.

In this way, a transparent pattern was produced.

—Evaluation 1—

The transparent pattern obtained above was evaluated and measured as follows. The results of evaluation and measurement are shown in Table 2 below.

(1-1) Profile of Transparent Pattern

The profile of the 1.2 μm-square pattern of the obtained color filter was observed at a magnification of 30,000 from above the color filer on the silicon wafer by using Critical Dimension SEM (S-7800H, manufactured by Hitachi Ltd.), and the corner shape was evaluated in accordance with the following criteria. The evaluation results are shown in Table 2 below. Incidentally, the rounded corner shape is differentiated from the neighbored pattern profile of other colors at the production of a device and measured as a color mixture or a noise when recognizing the image, and this gives rise to deterioration of the device performance.

<Evaluation Criteria>

A: The corner was little rounded and a good rectangular shape was obtained.

B: The corner was rounded but this was a practically allowable level.

C: The corner was rounded like a fan and a rectangular shape was not obtained.

(1-2) Cross-Sectional Profile of Transparent Pattern

The 1.2 μm-square pattern of the color filter obtained was cut along a plane orthogonal to the color filter plane, and the cross-sectional profile thereof was observed at a magnification of 30,000 by using SEM (S-4800, manufactured by Hitachi High-Technologies Corporation.). The cross-sectional profile was evaluated in accordance with the following criteria. Incidentally, when the cross-sectional profile is forwardly tapered, the pattern is overlapped with the adjacent pixel, and the adjacent pixel pattern profile disadvantageously fails in having a desired rectangular shape.

<Evaluation Criteria>

Figure 1:
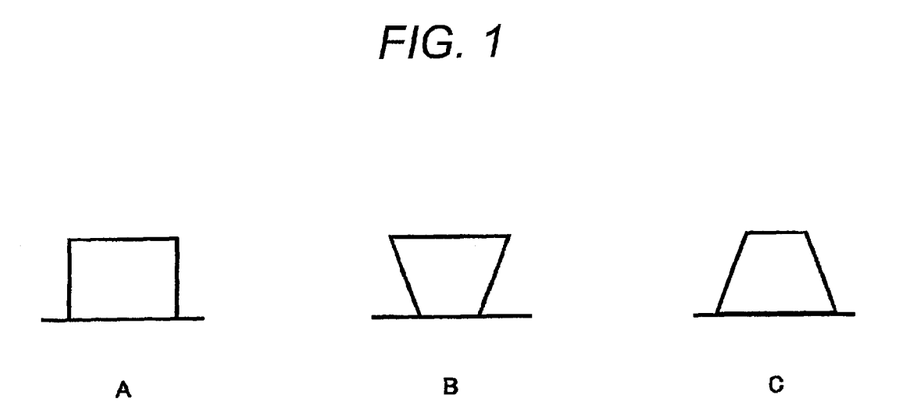
FIG. 1 A schematic view showing the cross-sectional profile of a transparent pattern.

As shown in FIG. 1,

Profile A: (A) the shape was rectangular and a good profile was obtained,

Profile B: (B) the shape was reversely tapered but this was a practically allowable level, and Profile C: (C) the shape was forwardly tapered and a rectangular shape was not obtained.

(1-3) Peripheral Scum

The pixel pattern of the color filter after post baking was observed at a magnification of 30,000 from above the color filter on the silicone wafer by using Critical Dimension SEM (S-7800H, manufactured by Hitachi Ltd.), and the presence or absence of generation of the scum was measured with an eye and evaluated in accordance with the following criteria:

<Evaluation Criteria>

A: Development scum was not observed.

B: Development scum was slightly observed but this was a practically allowable level.

C: Scum was seriously generated.

(1-4) Residual Film Ratio

The film thickness $D^1$ of the pixel pattern of the color filter after post baking and the film thickness $D^2$ after exposure but before development were measured using a stylus surface profile meter (Dektak 8, manufactured by Nihon Veeco K.K.), the obtained film thickness $D^1$ was divided by the film thickness $D^2$ to determine the residual film ratio (%; $=D^1/D^2 \times 100$), and the value obtained was used as an index and evaluated in accordance with the following criteria. Incidentally, in view of exposure sensitivity, the residual film ratio is preferably higher. The results are shown in Table 2 below.

<Evaluation Criteria>

A: The exposure sensitivity was good and the residual film ratio was 70% or more.

B: The exposure sensitivity was insufficient and the residual film ratio was less than 70%.

(1-5) Line Width

The profile of the pixel pattern of the color filter after exposure at 600 mW/cm² (low illuminance) or 1,200 mW/cm² (high illuminance), development and post baking was observed at a magnification of 30,000 from above the color filter on the silicon wafer by using Critical Dimension SEM (S-7800H, manufactured by Hitachi, Ltd.). In view of an appropriate dimension as contrasted with the 1.2 µm-square pixel of the mask pattern, the line width was evaluated in accordance with the following criteria. The evaluation result are shown in Table 2 below.

<Evaluation Criteria>

A: The line width was from 1.00 µm to less than 1.40 µm.

B: The line width was less than 1.00 µm or 1.40 µm or more.

(1-6) Exposure Illuminance Dependency

A. Line Width |a-b|

With respect to the pixel patterns obtained as above by exposure in two levels (high illuminance: 1,200 mW/cm², low illuminance: 600 mW/cm²), the line width a (µm) with low illuminance and the line width b (µm) with high illuminance obtained in the evaluation of the above "(1-5) Line Width" were compared, and the line width difference (=|a-b|) determined therefrom was used as an index and evaluated in accordance with the following criteria. In a color filter for solid-state imaging devices, the uniformity of line width of the obtained pattern is important, and therefore, the evaluation was performed with a threshold value of 0.05 µm. Incidentally, the notation "| |" indicates an absolute value.

<Evaluation Criteria>

A: The line width difference was less than 0.05 µm.

B: The line width difference was 0.05 µm or more.

B. Film Residual Ratio |c-d|

With respect to the pixel patterns obtained as above by exposure in two levels (high illuminance: 1,200 mW/cm², low illuminance: 600 mW/cm²), the residual film ratio c (%) with low illuminance and the residual film ratio d (%) with high illuminance above in the evaluation of the above "(1-4) Residual Film Ratio" were compared, and the difference in residual film ratio (=|c-d|) determined therefrom was used as an index and evaluated in accordance with the following criteria. In a color filter for solid-state imaging devices, the uniformity of film thickness of the obtained pattern is important, and therefore, the evaluation was performed with a threshold value of 1.0%. Incidentally, the notation "| |" indicates an absolute value.

<Evaluation Criteria>

A: The difference in residual film ratio was less than 1.0%.

B: The difference in residual film ratio was 1.0% or more.

Examples 2 to 7

Formation of Transparent Pattern of Color Filter for Solid-State Imaging Device

Photosensitive transparent resin compositions were prepared in the same manner as in Example 1 except that in Example 1, the composition of the photosensitive transparent resin composition was changed as shown in Table 1 below, and color filters were produced. Also, the same evaluations as in Example 1 were performed. The results of evaluation and measurement are shown in Table 2 below.

Comparative Examples 1 to 3

Formation of Transparent Pattern of Color Filter for Solid-State Imaging Device

Photosensitive transparent resin compositions were prepared in the same manner as in Example 1 except that in Example 1, the composition of the photosensitive transparent resin composition was changed as shown in Table 1 below, and color filters were produced. Also, the same evaluations as in Example 1 were performed. The results of evaluation and measurement are shown in Table 2 below.

TABLE 1

| | Resin | Monomer | Organic Solvent | Photopolymerization Initiator | Ultraviolet Absorber of Antioxidant | Content of Ultraviolet Absorber or Antioxidant (based on solid content) | Surfactant | Polymerization Inhibitor |
|---|---|---|---|---|---|---|---|---|
| Example 1 | Resin A (26.3 parts) | Monomer A (7.89 parts) | Solvent A (57.86 parts) | Initiator A (2.63 parts) | Compound III (1.26 parts) | 6.4% | Surfactant A (4.21 parts) | Polymerization Inhibitor A (0.001 parts) |
| Example 2 | Resin A (22.47 parts) | Monomer A (7.89 parts) | Solvent A (57.86 parts) | Initiator A (2.63 parts) | Compound IV (2.41 parts) | 12.3% | Surfactant A (4.21 parts) | Polymerization Inhibitor A (0.001 parts) |

TABLE 1-continued

| | Resin | Monomer | Organic Solvent | Photopolymerization Initiator | Ultraviolet Absorber of Antioxidant | Content of Ultraviolet Absorber or Antioxidant (based on solid content) | Surfactant | Polymerization Inhibitor |
|---|---|---|---|---|---|---|---|---|
| Example 3 | Resin A (17.37 parts) | Monomer A (7.89 parts) | Solvent A (57.86 parts) | Initiator A (2.63 parts) | Compound V (3.94 parts) | 20.0% | Surfactant A (4.21 parts) | Polymerization Inhibitor A (0.001 parts) |
| Example 4 | Resin A (19.33 parts) | Monomer A (7.89 parts) | Solvent A (57.86 parts) | Initiator A (2.63 parts) | Compound VI (3.35 parts) | 17.0% | Surfactant A (4.21 parts) | Polymerization Inhibitor A (0.001 parts) |
| Example 5 | Resin A (27.9 parts) | Monomer A (7.89 parts) | Solvent A (57.86 parts) | Initiator A (2.63 parts) | Compound VII (0.78 parts) | 4.0% | Surfactant A (4.21 parts) | Polymerization Inhibitor A (0.001 parts) |
| Example 6 | Resin A (26.5 parts) | Monomer A (7.89 parts) | Solvent A (57.86 parts) | Initiator A (2.63 parts) | Compound VIII (1.20 parts) | 6.1% | Surfactant A (4.21 parts) | Polymerization Inhibitor A (0.001 parts) |
| Example 7 | Resin A (17.0 parts) | Monomer A (7.89 parts) | Solvent A (57.86 parts) | Initiator A (2.63 parts) | Compound IX (4.05 parts) | 20.6% | Surfactant A (4.21 parts) | Polymerization Inhibitor A (0.001 parts) |
| Comparative Example 1 | Resin A (19.0 parts) | Monomer A (7.89 parts) | Solvent A (57.86 parts) | Initiator A (2.63 parts) | Compound X (3.46 parts) | 17.6% | Surfactant A (4.21 parts) | Polymerization Inhibitor A (0.001 parts) |
| Comparative Example 2 | Resin A (4.47 parts) | Monomer A (7.89 parts) | Solvent A (57.86 parts) | Initiator A (2.63 parts) | Compound XI (7.81 parts) | 39.7% | Surfactant A (4.21 parts) | Polymerization Inhibitor A (0.001 parts) |
| Comparative Example 3 | Resin A (30.43 parts) | Monomer A (7.89 parts) | Solvent A (57.86 parts) | Initiator A (2.63 parts) | Compound XII (0.02 parts) | 0.1% | Surfactant A (4.21 parts) | Polymerization Inhibitor A (0.001 parts) |

Structures of the compounds in columns of ultraviolet absorber and the like in Table 1 are shown below.

Compound XII [Antioxidant]:

Pentaerythritol tetrakis[3-(3,5-di-tert-butyl-4-hydroxyphenyl)propionate] ("IRGANOX 1010", produced by Ciba Geigy)

TABLE 2

| | Low Illuminance Exposure (600 mW/cm²) | | | | | High Illuminance Exposure (1200 mW/cm²) | | | | | Illuminance Dependency | |
|---|---|---|---|---|---|---|---|---|---|---|---|---|
| | Line Width a [μm] | Residual Film Ratio c [%] | Pattern Profile | Cross-Sectional Profile | Scum | Line Width b [μm] | Residual Film Ratio d [%] | Pattern Profile | Cross-Sectional Profile | Scum | Line Width \|a − b\| [μm] | Residual Film Ratio \|c − d\| [%] |
| Example 1 | 1.21 A | 74.5 A | A | A | A | 1.22 A | 74.9 A | A | A | A | 0.01 A | 0.4 A |
| Example 2 | 1.20 A | 74.4 A | A | A | A | 1.21 A | 74.6 A | A | A | A | 0.01 A | 0.2 A |
| Example 3 | 1.22 A | 74.9 A | A | A | A | 1.24 A | 75.0 A | A | A | A | 0.02 A | 0.1 A |
| Example 4 | 1.19 A | 74 A | A | A | A | 1.22 A | 74.5 A | A | A | A | 0.03 A | 0.5 A |
| Example 5 | 1.21 A | 74.5 A | A | A | A | 1.24 A | 75.1 A | A | A | A | 0.03 A | 0.6 A |
| Example 6 | 1.20 A | 74.5 A | A | A | A | 1.22 A | 74.9 A | A | A | A | 0.02 A | 0.4 A |
| Example 7 | 1.22 A | 74.9 A | A | A | A | 1.24 A | 75.0 A | A | A | A | 0.02 A | 0.1 A |
| Comparative Example 1 | 0.95 B | 65.2 B | C | B | A | 1.18 A | 72.2 A | A | A | A | 0.23 B | 7.0 B |
| Comparative Example 2 | 0.96 B | 68.0 B | C | B | A | 1.21 A | 74.3 A | A | A | A | 0.16 B | 6.3 B |
| Comparative Example 3 | 1.20 A | 74.3 A | A | C | C | 1.24 A | 75.0 A | A | A | C | 0.04 A | 0.7 A |

As seen from Table 2, in Examples using the ultraviolet absorber represented by formula (1), the pattern profile was good, the scum was suppressed, and the exposure illuminance dependency was small.

On the other hand, in Comparative Examples using other kinds of ultraviolet absorbers, that is, triazine-based or benzotriazole-based ultraviolet absorber (Compound X, Compound XI), the variation in line width and residual film ratio was large particularly at low illuminance exposure, and the exposure illuminance dependency could not be suppressed. Also, in Comparative Example using Compound XII that is an antioxidant, the exposure illuminance dependency was small to a certain extent, but generation of development scum could not be suppressed.

Examples 8 to 14 and Comparative Examples 4 to 6

Formation of Photospacer for Liquid Crystal Display

Photosensitive transparent resin compositions used in Examples 1 to 7 and Comparative Examples 1 to 3 were prepared, and each composition was spin-coated on a glass substrate (Corning 1737) and then prebaked in an oven at 100° C. for 120 seconds to form a coating film having a thickness of 2.0 μm after drying. Subsequently, the coating film was exposed with an exposure dose of 100 mJ/cm² by using a square mask having a mask dimension of the one-side width being 10 μm at two illuminance levels of 20 mW/cm² (low illuminance) and 40 mW/cm² (high illuminance) and then subjected to puddle development at room temperature for 40 seconds by applying a 60% aqueous solution of organic alkaline developer CD-2000 (produced by Fujifilm Electronic Materials Co., Ltd.) onto the exposed coating film. After the development, pure water was sprayed like a shower to wash out the developer, and the coating film subjected as above to exposure and development was heat-treated (post baking) in an oven at 220° C. for 30 minutes.

In this way, a photospacer was produced.

—Evaluation 2—

The photospacer obtained above was evaluated and measured as follows. The results of evaluation and measurement are shown in Table 3 below.

(2-1) Profile of Transparent Pattern

The profile of the 10 μm-square transparent pattern of the obtained color filter was observed at a magnification of 30,000 from above the color filer on the glass by using Critical Dimension SEM (S-7800H, manufactured by Hitachi Ltd.), and the corner shape was evaluated in accordance with the following criteria. The evaluation results are shown in Table 3 below. Incidentally, the rounded corner shape is differentiated from the neighbored pattern profile of other colors at the production of a device and measured as a color mixture or a noise when recognizing the image, and this gives rise to deterioration of the device performance.

<Evaluation Criteria>

A: The corner was little rounded and a good rectangular shape was obtained.

B: The corner was rounded but this was a practically allowable level.

C: The corner was rounded like a fan and a rectangular shape was not obtained.

(2-2) Cross-Sectional Profile of Photospacer

The 10 μm-square transparent pattern of the color filter obtained was cut along a plane orthogonal to the color filter plane, and the cross-sectional profile thereof was observed at a magnification of 30,000 by using SEM (S-4800, manufactured by Hitachi High-Technologies Corporation). The cross-sectional profile was evaluated in accordance with the following criteria.

<Evaluation Criteria>

Figure 2:
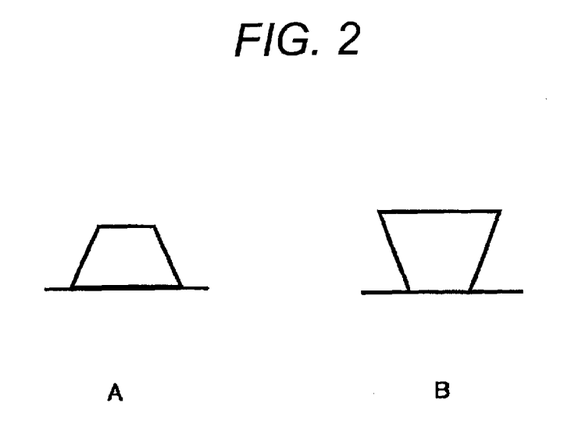
FIG. 2 A schematic view showing the cross-sectional shape of a photospacer.

As shown in FIG. 2,

Profile A: (A) the shape was forwardly tapered and a good profile was obtained, and Profile B: (B) the shape was reversely tapered and this was a practically unallowable level.

(2-3) Peripheral Scum

The pixel pattern of the color filter after post baking was observed at a magnification of 30,000 from above the color filter on the glass by using Critical Dimension SEM (S-7800H, manufactured by Hitachi Ltd.), and the presence or absence of generation of the scum was measured with an eye and evaluated in accordance with the following criteria:

<Evaluation Criteria>

A: Development scum was not observed.

B: Development scum was slightly observed but this was a practically allowable level.

C: Scum was seriously generated.

(2-4) Residual Film Ratio

The film thickness $D^1$ of the pixel pattern of the color filter after post baking and the film thickness $D^2$ after exposure but before development were measured using a stylus surface profile meter (Dektak 8, manufactured by Nihon Veeco K.K.), the obtained film thickness $D^1$ was divided by the film thickness $D^2$ to determine the residual film ratio (%; $=D^1/D^2\times100$), and the value obtained was used as an index and evaluated in accordance with the following criteria. Incidentally, in view of exposure sensitivity, the residual film ratio is preferably higher. The results are shown in Table 3 below.

<Evaluation Criteria>

A: The exposure sensitivity was good and the residual film ratio was 70% or more.

B: The exposure sensitivity was insufficient and the residual film ratio was less than 70%.

(2-5) Line Width

The profile of the pixel pattern of the color filter after exposure at 20 mW/cm² (low illuminance) or 40 mW/cm² (high illuminance), development and post baking was observed at a magnification of 30,000 from above the color filter on the glass by using Critical Dimension SEM (S-7800H, manufactured by Hitachi, Ltd.). In view of an appropriate dimension as contrasted with the 10.0 μm-square pixel of the mask pattern, the line width was evaluated in accordance with the following criteria. The evaluation result are shown in Table 3 below.

<Evaluation Criteria>

A: The line width was from 9.5 μm to less than 10.5 μm.

B: The line width was less than 9.5 μm or 10.5 μm or more.

(2-6) Exposure Illuminance Dependency

A. Line Width |a-b|

With respect to the pixel patterns obtained as above by exposure in two levels (high illuminance: 40 mW/cm², low illuminance: 20 mW/cm²), the line width a (μm) with low illuminance and the line width b (μm) with high illuminance obtained in the evaluation of the above "(2-5) Line Width" were compared, and the line width difference (=|a-b|) determined therefrom was used as an index and evaluated in accordance with the following criteria. In a color filter for solid-state imaging devices, the uniformity of line width of the obtained pattern is important, and therefore, the evaluation was performed with a threshold value of 0.05 μm. Incidentally, the notation "| |" indicates an absolute value.

<Evaluation Criteria>

A: The line width difference was less than 0.5 μm.

B: The line width difference was 0.5 μm or more.

B. Film Residual Ratio |c-d|

With respect to the pixel patterns obtained as above by exposure in two levels (high illuminance: 40 mW/cm², low illuminance: 20 mW/cm²), the residual film ratio c (%) with low illuminance and the residual film ratio d (%) with high illuminance obtained in the evaluation of the above "(2-4) Residual Film Ratio" were compared, and the difference in residual film ratio (=|c-d|) determined therefrom was used as an index and evaluated in accordance with the following criteria. In a color filter for solid-state imaging devices, the uniformity of film thickness of the obtained pattern is important, and therefore, the evaluation was performed with a threshold value of 1.0%. Incidentally, the notation "| |" indicates an absolute value.

<Evaluation Criteria>

A: The difference in residual film ratio was less than 1.0%.

B: The difference in residual film ratio was 1.0% or more.

TABLE 3

| | Low Illuminance Exposure (20 mW/cm²) | | | | | High Illuminance Exposure (40 mW/cm²) | | | | | Illuminance Dependency | |
|---|---|---|---|---|---|---|---|---|---|---|---|---|
| | Line Width a [μm] | Residual Film Ratio c [%] | Pattern Profile | Cross-Sectional Profile | Scum | Line Width b [μm] | Residual Film Ratio d [%] | Pattern Profile | Cross-Sectional Profile | Scum | Line Width \|a − b\| [μm] | Residual Film Ratio \|c − d\| [%] |
| Example 8 | 10.1 A | 74.5 A | A | A | A | 10.2 A | 74.9 A | A | A | A | 0.1 A | 0.4 A |
| Example 9 | 10.2 A | 74.4 A | A | A | A | 10.2 A | 74.6 A | A | A | A | 0.0 A | 0.2 A |
| Example 10 | 10.2 A | 74.9 A | A | A | A | 10.4 A | 75.0 A | A | A | A | 0.2 A | 0.1 A |
| Example 11 | 10.1 A | 74.0 A | A | A | A | 10.3 A | 74.5 A | A | A | A | 0.2 A | 0.5 A |
| Example 12 | 10.2 A | 74.5 A | A | A | A | 10.4 A | 75.1 A | A | A | A | 0.3 A | 0.6 A |
| Example 13 | 10.3 A | 74.5 A | A | A | A | 10.4 A | 74.9 A | A | A | A | 0.1 A | 0.4 A |
| Example 14 | 10.3 A | 74.9 A | A | A | A | 10.4 A | 75.0 A | A | A | A | 0.1 A | 0.1 A |
| Comparative Example 4 | 9.2 B | 65.2 B | C | B | A | 10.8 B | 72.2 A | A | A | A | 1.6 B | 7.0 B |
| Comparative Example 5 | 9.4 B | 68.0 B | C | B | A | 10.2 A | 74.3 A | A | A | A | 0.8 B | 6.3 B |
| Comparative Example 6 | 12.0 B | 80.1 A | A | A | C | 12.4 B | 82.1 A | A | A | C | 0.4 A | 2.0 B |

As seen from Table 3, in Examples using the compound represented by formula (I), the pattern profile was good, the scum was suppressed, and the exposure illuminance dependency was small.

On the other hand, in Comparative Examples using other kinds of ultraviolet absorbers, that is, triazine-based or benzotriazole-based ultraviolet absorber (Compound X, Compound XI), the variation in line width and residual film ratio was large particularly at low illuminance exposure, and the exposure illuminance dependency could not be suppressed. Also, in Comparative Example using Compound XII that is an antioxidant, the exposure illuminance dependency was small to a certain extent, but generation of development scum could not be suppressed.

INDUSTRIAL APPLICABILITY

According to the present invention, a photosensitive transparent resin composition capable of reducing the exposure illuminance dependency (particularly, the variation of profile such as line width at low illuminance corresponding to 95% or less of high illuminance), allowing high residual film ratio and small development scum, and stably forming a pattern excellent in resolution can be provided.

The photosensitive transparent resin composition of the present invention can be used for a production method of a color filter ensuring little decrease in the transmittance for visible light and enabling display of a high-quality definite image.

While the invention has been described in detail and with reference to specific embodiments thereof, it will be apparent to one skilled in the art that various changes and modifications can be made therein without departing from the spirit and scope of the invention.

This application is based on Japanese Patent Application (Patent Application No. 2008-094248) filed on Mar. 31, 2008, the contents of which are incorporated herein by way of reference.

The invention claimed is:

1. A photosensitive transparent resin composition containing at least a polymerizable monomer, an alkali-soluble resin, a photopolymerization initiator and a compound represented by the following formula (I):

Formula (I)

wherein each of $R^1$ and $R^2$ independently represents a hydrogen atom, an alkyl group having a carbon number of 1 to 20 or an aryl group having a carbon number of 6 to 20, $R^1$ and $R^2$ may be the same or different but are not a hydrogen atom at the same time, $R^1$ and $R^2$ may form a cyclic amino group together with the nitrogen atom, $R^3$ represents —COOR$^5$ or —SO$_2$R$^5$, wherein $R^5$ represents an alkyl group having a carbon number of 1 to 20 or an aryl group having a carbon number of 6 to 20, $R^4$ represents a cyano group or —SO$_2$R$^6$, wherein $R^6$ represents an alkyl group having a carbon number of 1 to 20 or an aryl group having a carbon number of 6 to 20, and $R^3$ and $R^4$ may be combined with each other to form a cyclic electron-withdrawing group.

2. A production method of a color filter, comprising coating the photosensitive transparent resin composition according to claim 1, exposing the coated and formed coating layer through a photomask, and developing the coating layer to form a pattern.

3. A color filter produced by the production method of a color filter according to claim 2.

4. The photosensitive transparent resin composition according to claim 1, wherein the content of said compound represented by formula (I) is from 0.01 to 30 mass % based on the solid content of the photosensitive transparent resin composition.

5. The photosensitive transparent resin composition according to claim 1, wherein at least one of said photopolymerization initiator is an oxime ester-based compound.

6. The photosensitive transparent resin composition according to claim 1, wherein the composition contains a polyfunctional (meth)acrylic compound as the polymerizable monomer.

7. The photosensitive transparent resin composition according to claim 1, wherein the alkali-soluble resin is a polymer having a carboxylic acid in the side chain.

8. The photosensitive transparent resin composition of claim 1, wherein $R^4$ represents —SO$_2$R$^6$.

9. The photosensitive transparent resin composition of claim 1, wherein $R^3$ represents —COOR$^5$.

10. A photosensitive transparent resin composition containing at least a polymerizable monomer, an alkali-soluble resin, a photopolymerization initiator and a compound represented by the following formula (I):

Formula (I)

wherein each of $R^1$ and $R^2$ independently represents a hydrogen atom, an alkyl group having a carbon number of 1 to 20 or an aryl group having a carbon number of 6 to 20, $R^1$ and $R^2$ may be the same or different but are not a hydrogen atom at the same time, $R^1$ and $R^2$ may form a cyclic amino group together with the nitrogen atom, $R^3$ independently represents an electron-withdrawing group, $R^4$ represents —SO$_2$R$^6$ or —CO$_2$R$^6$, wherein $R^6$ represents an alkyl group having a carbon number of 1 to 20 or an aryl group having a carbon number of 6 to 20, and $R^3$ and $R^4$ are not combined with each other to form a cyclic electron-withdrawing group.

11. The photosensitive transparent resin composition of claim 10, wherein $R^3$ independently represents a cyano group, —COOR$^5$, —CONHR$^5$, —COR$^5$, or —SO$_2$R$^5$, wherein $R^5$ represents an alkyl group having a carbon number of 1 to 20 or an aryl group having a carbon number of 6 to 20.

12. A production method of a color filter, comprising coating the photosensitive transparent resin composition according to claim 10, exposing the coated and formed coating layer through a photomask, and developing the coating layer to form a pattern.

13. A color filter produced by the production method of a color filter according to claim 12.

14. The photosensitive composition of claim 10, wherein $R^4$ represents —SO$_2$R$^6$.

15. The photosensitive transparent resin composition according to claim 10, wherein the content of said compound represented by formula (I) is from 0.01 to 30 mass % based on the solid content of the photosensitive transparent resin composition.

16. The photosensitive transparent resin composition according to claim 10, wherein at least one of said photopolymerization initiator is an oxime ester-based compound.

* * * * *